(12) United States Patent
Ma et al.

(10) Patent No.: US 10,311,783 B2
(45) Date of Patent: Jun. 4, 2019

(54) PIXEL CIRCUIT, METHOD FOR DRIVING THE SAME, DISPLAY PANEL AND DISPLAY DEVICE

(71) Applicant: BOE TECHNOLOGY GROUP CO., LTD., Beijing (CN)

(72) Inventors: Zhanjie Ma, Beijing (CN); Tuo Sun, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 352 days.

(21) Appl. No.: 15/322,135

(22) PCT Filed: Aug. 2, 2016

(86) PCT No.: PCT/CN2016/092855
§ 371 (c)(1),
(2) Date: Dec. 26, 2016

(87) PCT Pub. No.: WO2017/121105
PCT Pub. Date: Jul. 20, 2017

(65) Prior Publication Data
US 2018/0218674 A1    Aug. 2, 2018

(30) Foreign Application Priority Data

Jan. 15, 2016    (CN) .......................... 2016 1 0028988

(51) Int. Cl.
*G09G 3/3233*    (2016.01)
*G09G 3/3208*    (2016.01)
(Continued)

(52) U.S. Cl.
CPC ......... *G09G 3/3233* (2013.01); *G09G 3/3208* (2013.01); *G09G 3/3258* (2013.01);
(Continued)

(58) Field of Classification Search
CPC .. G09G 3/3233; G09G 3/3208; G09G 3/3258; G09G 3/3266; G09G 3/3275; G09G 2300/0809; H01L 27/3276
See application file for complete search history.

(56) References Cited

U.S. PATENT DOCUMENTS

2008/0284691 A1* 11/2008 Chung ................. G09G 3/3291
345/76
2010/0065840 A1* 3/2010 Yamazaki ............ G02F 1/1368
257/43
(Continued)

FOREIGN PATENT DOCUMENTS

CN    102163403 A    8/2011
CN    102651192 A    8/2012
(Continued)

OTHER PUBLICATIONS

First Office Action for Chinese Application No. 201610028988.1, dated Oct. 9, 2017, 8 Pages.
(Continued)

*Primary Examiner* — Sejoon Ahn
(74) *Attorney, Agent, or Firm* — Brooks Kushman P.C.

(57) ABSTRACT

The present disclosure provides a pixel circuit, a method for driving the same, a display panel and a display device. The pixel circuit includes a writing module configured to write a signal from a data signal end into a first node, a switch module configured to electrically connected the first node to a second node, a power input module configured to input a signal from a first power signal end into the second node, a resetting module configured to output a signal from a reference signal end to a third node and a fourth node, a driving module configured to output a signal from the second node to the fourth node, and a first maintenance module configured to stabilize potentials at the first node and the second node through the signals from the first node and the second node.

12 Claims, 4 Drawing Sheets

(51) Int. Cl.
    *G09G 3/3258* (2016.01)
    *G09G 3/3266* (2016.01)
    *G09G 3/3275* (2016.01)
    *H01L 27/32* (2006.01)

(52) U.S. Cl.
    CPC ......... *G09G 3/3266* (2013.01); *G09G 3/3275* (2013.01); *H01L 27/3276* (2013.01); *G09G 2300/0809* (2013.01)

(56) References Cited

U.S. PATENT DOCUMENTS

| | | |
|---|---|---|
| 2011/0205205 A1 | 8/2011 | Yamamoto et al. |
| 2012/0327064 A1 | 12/2012 | Qi et al. |
| 2017/0018229 A1 | 1/2017 | Zhang et al. |
| 2017/0270860 A1 | 9/2017 | Wang et al. |

FOREIGN PATENT DOCUMENTS

| | | |
|---|---|---|
| CN | 104200771 A | 12/2014 |
| CN | 104217682 A | 12/2014 |
| CN | 104933993 A | 9/2015 |
| CN | 105185305 A | 12/2015 |
| CN | 105632403 A | 6/2016 |
| JP | 2005164891 A | 6/2005 |
| JP | 2007101798 A | 4/2007 |
| JP | 2008310075 A | 12/2008 |

OTHER PUBLICATIONS

International Search Report and Written Opinion for Application No. PCT/CN2016/092855, dated Oct. 26, 2016, 10 Pages.

* cited by examiner

US 10,311,783 B2

PIXEL CIRCUIT, METHOD FOR DRIVING THE SAME, DISPLAY PANEL AND DISPLAY DEVICE

CROSS-REFERENCE TO RELATED APPLICATIONS

This application is the U.S. national phase of PCT Application No. PCT/CN2016/092855 filed on Aug. 2, 2016, which claims priority to Chinese Patent Application No. 201610028988.1 filed on Jan. 15, 2016, the disclosures of which are incorporated in their entirety by reference herein.

TECHNICAL FIELD

The present disclosure relates to the field of display technology, in particular to a pixel circuit, a method for driving the same, a display panel and a display device.

BACKGROUND

Along with the development of the display technology, an organic light-emitting diode (OLED) display device has currently become one of the hot issues in the field of flat-panel display, and more and more OLED display panels have been available in the market. As compared with a traditional thin film transistor liquid crystal display (TFT LCD), it is able for the OLED display panel to provide a more rapid response speed, a higher contrast and a wider viewing angle.

Recently, as the demand on high resolution display increases, a size of each pixel for the OLED display panel becomes smaller and smaller, and meanwhile a capacitance of a capacitor in a pixel circuit for driving an OLED to emit light becomes smaller and smaller. As a result, the stability of a potential at a node for driving the OLED to emit light may be deteriorated, and an entire display effect of the display panel may be adversely affected.

Hence, there is an urgent need to improve the stability of the potential at the node in the pixel circuit, so as to improve the display effect of the display panel.

SUMMARY

An object of the present disclosure is to provide a pixel circuit, a method for driving the same, a display panel and a display device, so as to improve the stability of a potential at a node for driving an OLED to emit light, thereby to improve a display effect of the display panel.

In one aspect, the present disclosure provides in some embodiments a pixel circuit, including a writing module, a driving module, a resetting module, a switch module, a power input module, a first maintenance module and a light-emitting element. A control end of the writing module is connected to a scanning signal end, an input end thereof is connected to a data signal end, and an output end thereof is connected to a first node. The writing module is configured to write a signal from the data signal end into the first node under the control of the scanning signal end. A control end of the switch module is connected to a resetting signal end, an input end thereof is connected to a second node, and an output end is connected to the first node. The switch module is configured to electrically connect the first node to the second node under the control of the resetting signal end. A control end of the power input module is connected to a light-emitting signal end, an input end thereof is connected to a first power signal end, and an output end thereof is connected to the second node. The power input module is configured to input a signal from the first power signal end into the second node under the control of the light-emitting signal end. A first control end and a second control end of the resetting module are connected to the resetting signal end, an input end thereof is connected to a reference signal end, a first output end thereof is connected to a third node, and a second output end is connected to a fourth node. The resetting module is configured to output a signal from the reference signal end to the third node and the fourth node under the control of the resetting signal end. A control end of the driving module is connected to the third node, a first input end thereof is connected to the first node, a second input end thereof is connected to the second node, and an output end is connected to the fourth node. A signal from the first node is configured to adjust a potential at the third node. The driving module is configured to output a signal from the second node to the fourth node under the control of the third node. The light-emitting element is connected between the fourth node and a second power signal end. The first maintenance module is connected between the first node and the second node, and configured to stabilize potentials at the first node and the second node through the signals from the first node and the second node.

In at least one embodiment of the present disclosure, the first maintenance module includes a first capacitor connected between the first node and the second node.

In at least one embodiment of the present disclosure, the pixel circuit further includes a second maintenance module connected between the first power signal end and the first node and configured to stabilize the potential at the first node through the signal from the first power signal end.

In at least one embodiment of the present disclosure, the second maintenance module includes a second capacitor connected between the first power signal end and the first node.

In at least one embodiment of the present disclosure, the pixel circuit further includes a light-emission control module, a control end of which is connected to the light-emitting signal end, an input end of which is connected to the fourth node, an output end of which is connected to an input end of the light-emitting element, and which is configured to output a signal from the fourth node to the input end of the light-emitting element under the control of the light-emitting signal end.

In at least one embodiment of the present disclosure, the light-emission control module includes a first switching transistor, a gate electrode of which is connected to the light-emitting signal end, a first electrode of which is connected to the fourth node, and a second electrode of which is connected to the input end of the light-emitting element.

In at least one embodiment of the present disclosure, the writing module includes a second switching transistor, a gate electrode of which is connected to the scanning signal end, a first electrode of which is connected to the data signal end, and a second electrode of which is connected to the first node.

In at least one embodiment of the present disclosure, the switch module includes a third switching transistor, a gate electrode of which is connected to the resetting signal end, a first electrode of which is connected to the second node, and a second node of which is connected to the first node.

In at least one embodiment of the present disclosure, the power input module includes a fourth switching transistor, a gate electrode of which is connected to the light-emitting signal end, a first electrode of which is connected to a first power signal end, and a second electrode of which is connected to the second node.

In at least one embodiment of the present disclosure, the resetting module includes: a fifth switching transistor, a gate electrode of which is connected to the resetting signal end, a first electrode of which is connected to the reference signal end and a second electrode of which is connected to the third node; and a sixth switching transistor, a gate electrode of which is connected to the resetting signal end, a first electrode of which is connected to the reference signal end, and a second electrode of which is connected to the fourth node.

In at least one embodiment of the present disclosure, the driving module includes: a driving transistor, a gate electrode of which is connected to the third node, a first electrode of which is connected to the second node, and a second electrode of which is connected to the fourth node; and a third capacitor connected between the first node and the third node.

In at least one embodiment of the present disclosure, the first switching transistor, the second switching transistor, the third switching transistor, the fourth switching transistor, the fifth switching transistor, the sixth switching transistor and the driving transistor are all TFTs or metal oxide semiconductor field effect transistors (MOSFETs).

In another aspect, the present disclosure provides in some embodiments a method for driving the above-mentioned pixel circuit, including steps of: at a first stage, outputting, by the resetting module, a signal from the reference signal end to the third node and the fourth node under the control of the resetting signal end, outputting, by the power input module, a signal from the first power signal end to the second node under the control of the light-emitting signal end, and enabling, by the switch module, the first node to be electrically connected to the second node under the control of the resetting signal end; at a second stage, outputting, by the resetting module, the signal from the reference signal end to the third node and the fourth node under the control of the resetting signal end, enabling, by the switch module, the first node to be electrically connected to the second node under the control of the resetting signal end, and enabling the power input module to be turned off under the control of the light-emitting signal end; at a third stage, outputting, by the writing module, a signal from the data signal end to the first node under the control of the scanning signal end; at a fourth stage, outputting, by the writing module, the signal from the data signal end to the first node under the control of the scanning signal end, and outputting, by the power input module, the signal from the first power signal end to the second node under the control of the light-emitting signal end; and at a fifth stage, outputting, by the power input module, the signal from the first power signal end to the second node under the control of the light-emitting signal end, and outputting, by the driving module, a signal from the second node to the fourth node under the control of the third node, so as to drive the light-emitting element to emit light.

In at least one embodiment of the present disclosure, the method further includes, at the first stage, the fourth stage and the fifth stage, outputting, by the light-emission control module, a signal from the fourth node to the input end of the light-emitting element under the control of the light-emitting signal end.

In at least one embodiment of the present disclosure, the method further includes, at a sixth stage, enabling the resetting module to be turned off under the control of the resetting signal end, enabling the writing module to be turned off under the control of the scanning signal end, and enabling the power input module and the light-emission control module to be turned off under the control of the light-emitting signal end, so as to maintain a potential at the second node to be the same as a potential at the second node at the fifth stage.

In yet another aspect, the present disclosure provides in some embodiments a display panel including the above-mentioned pixel circuit.

In still yet another aspect, the present disclosure provides in some embodiments a display device including the above-mentioned display panel.

According to the pixel circuit, its driving method, the display panel and the display device in the embodiments of the present disclosure, the pixel circuit includes the writing module, the driving module, the resetting module, the switch module, the power input module, the first maintenance module and the light-emitting element. The writing module is configured to write the signal from the data signal end into the first node under the control of the scanning signal end. The switch module is configured to electrically connect the first node to the second node under the control of the resetting signal end. The power input module is configured to input the signal from the first power signal end to the second node under the control of the light-emitting signal end. The resetting module is configured to output the signal from the reference signal end to the third node and the fourth node under the control of the resetting signal end. The driving module is configured to output the signal from the second node to the fourth node under the control of the third node. The first maintenance module is configured to stabilize the potentials at the first node and the second node through the signals from the first node and the second node. Through the operations of the writing module, the driving module, the resetting module, the switch module and the power input module under the control of the respective control signal ends, it is able to drive the light-emitting element to emit light. In addition, through the first maintenance module, it is able to stabilize a potential at a node for driving the light-emitting element to emit light, i.e., stabilize the potentials at the first node and the second node for driving the light-emitting element to emit light. As a result, it is able to stabilize the potential at a key node for driving the light-emitting element to emit light, thereby to improve a display effect of the display panel in the case of high-resolution display.

BRIEF DESCRIPTION OF THE DRAWINGS

In order to illustrate the technical solutions of the present disclosure or the related art in a clearer manner, the drawings for the present disclosure or the related art will be described hereinafter briefly. Obviously, the following drawings merely relate to some embodiments of the present disclosure, and based on these drawings, a person skilled in the art may obtain the other drawings without any creative effort. Shapes and sizes of the members in the drawings are for illustrative purposes only, but shall not be used to reflect any actual scale.

DETAILED DESCRIPTION

In order to make the objects, the technical solutions and the advantages of the present disclosure more apparent, the present disclosure will be described hereinafter in a clear and complete manner in conjunction with the drawings and embodiments. Obviously, the following embodiments merely relate to a part of, rather than all of, the embodiments of the present disclosure, and based on these embodiments, a person skilled in the art may, without any creative effort, obtain the other embodiments, which also fall within the scope of the present disclosure.

Unless otherwise defined, any technical or scientific term used herein shall have the common meaning understood by a person of ordinary skills. Such words as "first" and "second" used in the specification and claims are merely used to differentiate different components rather than to represent any order, number or importance. Similarly, such words as "one" or "one of" are merely used to represent the existence of at least one member, rather than to limit the number thereof. Such words as "connect" or "connected to" may include electrical connection, direct or indirect, rather than to be limited to physical or mechanical connection. Such words as "on", "under", "left" and "right" are merely used to represent relative position relationship, and when an absolute position of the object is changed, the relative position relationship will be changed too.

The present disclosure will be described hereinafter in conjunction with the drawings and embodiments.

Figure 1:
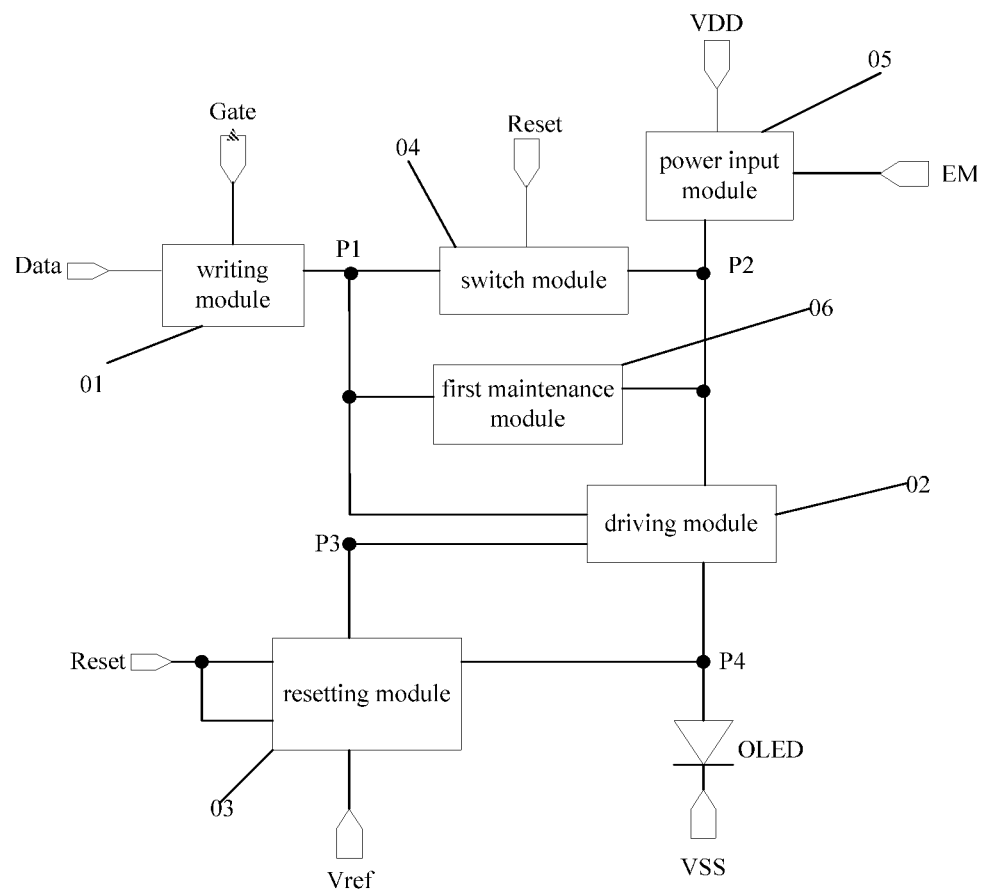
FIG. 1 is a schematic view showing a pixel circuit according to at least one embodiment of the present disclosure.

The present disclosure provides in some embodiments a pixel circuit which, as shown in FIG. 1, may include a writing module 01, a driving module 02, a resetting module 03, a switch module 04, a power input module 05, a first maintenance module 06 and a light-emitting element OLED.

A control end of the writing module 01 is connected to a scanning signal end Gate, an input end thereof is connected to a data signal end Data, and an output end thereof is connected to a first node P1. The writing module 01 is configured to write a signal from the data signal end Data into the first node P1 under the control of the scanning signal end Gate.

A control end of the switch module 04 is connected to a resetting signal end Reset, an input end thereof is connected to a second node P2, and an output end is connected to the first node P1. The switch module 04 is configured to electrically connect the first node P1 to the second node P2 under the control of the resetting signal end Reset.

A control end of the power input module 05 is connected to a light-emitting signal end EM, an input end thereof is connected to a first power signal end VDD, and an output end thereof is connected to the second node P2. The power input module 05 is configured to input a signal from the first power signal end VDD into the second node P2 under the control of the light-emitting signal end EM.

A first control end and a second control end of the resetting module 03 are connected to the resetting signal end Reset, an input end thereof is connected to a reference signal end Vref, a first output end thereof is connected to a third node P3, and a second output end is connected to a fourth node P4. The resetting module 03 is configured to output a signal from the reference signal end Reset to the third node P3 and the fourth node P4 under the control of the resetting signal end Reset.

A control end of the driving module 02 is connected to the third node P3, a first input end thereof is connected to the first node P1, a second input end thereof is connected to the second node P2, and an output end is connected to the fourth node P4. A signal from the first node P1 is configured to adjust a potential at the third node P3. The driving module 02 is configured to output a signal from the second node P2 to the fourth node P4 under the control of the third node P3.

The light-emitting element OLED is connected between the fourth node P4 and a second power signal end VSS. The first maintenance module 06 is connected between the first node P1 and the second node P2, and configured to stabilize potentials at the first node P1 and the second node P2 through the signals from the first node P1 and the second node P2.

According to the pixel circuit in the embodiments of the present disclosure, through the operations of the writing module, the driving module, the resetting module, the switch module and the power input module under the control of the respective control signal ends, it is able to drive the light-emitting element to emit light. In addition, through the first maintenance module, it is able to stabilize a potential at a node for driving the light-emitting element to emit light, i.e., stabilize the potentials at the first node and the second node for driving the light-emitting element to emit light. As a result, it is able to stabilize the potential at a key node for driving the light-emitting element to emit light, thereby to improve a display effect of the display panel in the case of high-resolution display.

Figure 2:
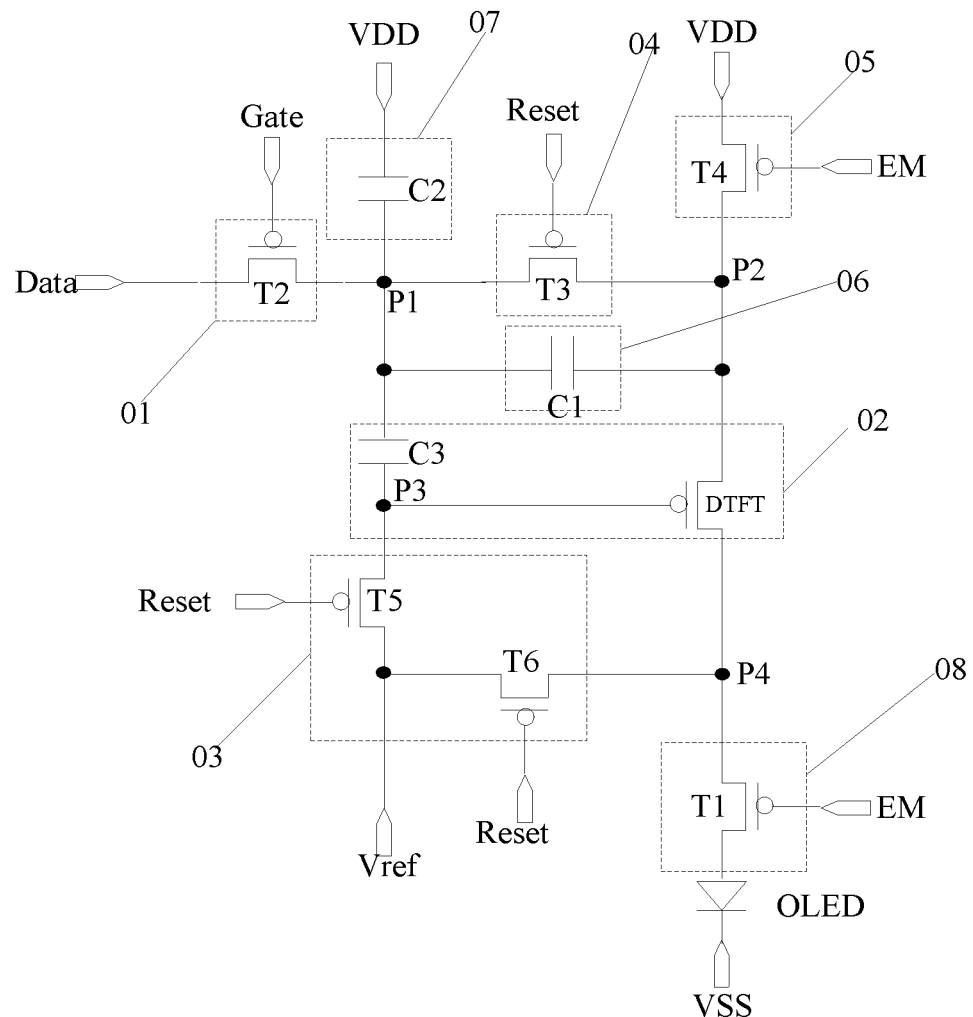
FIG. 2 is another schematic view showing the pixel circuit according to at least one embodiment of the present disclosure.

During the implementation, as shown in FIG. 2, the first maintenance module may include a first capacitor C1 connected between the first node P1 and the second node P2. To be specific, through the signals from the first node P1 and the second node P2, the first capacitor C1 is configured to adjust and maintain the potentials at the first node P1 and the second node P2 based on the principle of charge conservation.

During the implementation, as shown in FIG. 2, the pixel circuit may further include a second maintenance module 07 connected between the first power signal end VDD and the first node P1 and configured to stabilize the potential at the first node P1 through the signal from the first power signal end VDD. Through the second maintenance module, it is able to further maintain the potential at the first node, thereby to improve the stability of the potential at the first node.

During the implementation, as shown in FIG. 2, the second maintenance module may include a second capacitor C2 connected between the first power signal end VDD and the first node P1. Through coupling effect of the second capacitor, it is able to maintain the potential at the first node under the control of the signal from the first power signal end, thereby to improve the stability of the potential at the first node. In addition, in the case that the power input module is in an on state, the first capacitor is connected in parallel with the second capacitor, so as to further stabilize the potential at the first node. As a result, it is able to ensure the stability of the potential at the key node for driving the light-emitting element to emit light, thereby to improve the display effect of the display panel in the case of high-resolution display.

During the implementation, as shown in FIG. 2, the pixel circuit may further include a light-emission control module 08, a control end of which is connected to the light-emitting signal end EM, an input end of which is connected to the fourth node P4, an output end of which is connected to an input end of the light-emitting element OLED, and which is configured to output a signal from the fourth node P4 to the input end of the light-emitting element OLED under the control of the light-emitting signal end EM. Through the light-emission control module that is turned on under the control of the light-emitting signal end, it is able to output the signal from the fourth node to the input end of the light-emitting element, thereby to drive the light-emitting element to emit light.

During the implementation, as shown in FIG. 2, the light-emission control module may include a first switching transistor T1, a gate electrode of which is connected to the light-emitting signal end EM, a first electrode of which is connected to the fourth node P4, and a second electrode of which is connected to the input end of the light-emitting element OLED. To be specific, the first switching transistor T1 may be turned on under the control of the light-emitting signal end EM, so as to electrically connect the fourth node P4 to the input end of the light-emitting element OLED and output the signal from the fourth node P4 to the input end of the light-emitting element OLED, thereby to drive the light-emitting element OLED to emit light.

During the implementation, as shown in FIG. 2, the writing module may include a second switching transistor T2, a gate electrode of which is connected to the scanning signal end Gate, a first electrode of which is connected to the data signal end Data, and a second electrode of which is connected to the first node P1. To be specific, the second switching transistor T2 may be turned on under the control of the scanning signal end Gate, so as to electrically connect the data signal end Data to the first node P1, thereby to output the data signal from the data signal end Data to the first node P1.

During the implementation, as shown in FIG. 2, the switch module may include a third switching transistor T3, a gate electrode of which is connected to the resetting signal end Reset, a first electrode of which is connected to the second node P2, and a second node of which is connected to the first node P1. To be specific, the third switching transistor T3 may be turned on under the control of the resetting signal end Reset, so as to electrically connect the second node P2 to the first node P1.

During the implementation, as shown in FIG. 2, the power input module may include a fourth switching transistor T4, a gate electrode of which is connected to the light-emitting signal end EM, a first electrode of which is connected to a first power signal end VDD, and a second electrode of which is connected to the second node P2. To be specific, the fourth switching transistor T4 may be turned on the under the control of the light-emitting signal end EM, so as to electrically connect the first power signal end VDD to the second node P2, thereby to output the signal from the first power signal end VDD to the second node P2.

During the implementation, as shown in FIG. 2, the resetting module may include: a fifth switching transistor T5, a gate electrode of which is connected to the resetting signal end Reset, a first electrode of which is connected to the reference signal end Vref and a second electrode of which is connected to the third node P3; and a sixth switching transistor T6, a gate electrode of which is connected to the resetting signal end Reset, a first electrode of which is connected to the reference signal end Vref, and a second electrode of which is connected to the fourth node P4. To be specific, the fifth switching transistor T5 and the sixth switching transistor T6 may be turned on under the control of the resetting signal end Reset, so as to output the signal from the reference signal end Vref to the third node P3 and the fourth node P4, thereby to initialize the third node P3 and the fourth node P4.

During the implementation, as shown in FIG. 2, the driving module may include: a driving transistor DTFT, a gate electrode of which is connected to the third node P3, a first electrode of which is connected to the second node P2, and a second electrode of which is connected to the fourth node P4; and a third capacitor C3 connected between the first node P1 and the third node P3. To be specific, the third capacitor C3 may be configured to adjust the potential at the third node P3 in accordance with a change in the potential at the first node P1, so as to turn on the driving transistor DTFT under the control of the third node P3 and electrically connect the second node P2 to the fourth node P4, thereby to output the signal from the second node P2 to the fourth node P4.

Figure 4:
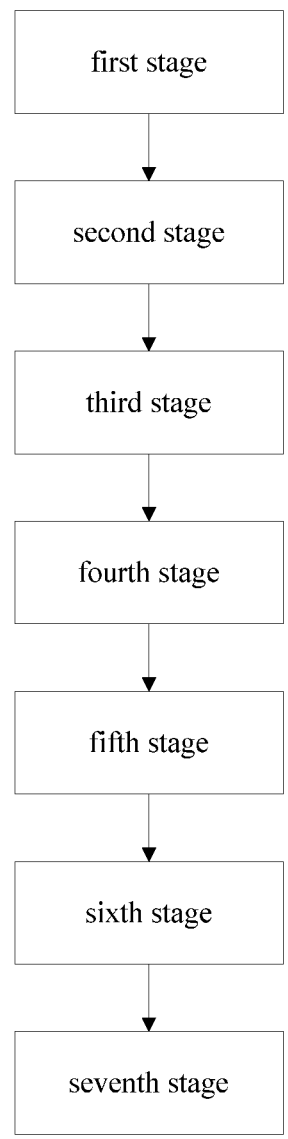
FIG. 4 is a flow chart of a method for driving the pixel circuit according to at least one embodiment of the present disclosure.

Based on an identical inventive concept, the present disclosure provides in some embodiments a method for driving the above-mentioned pixel circuit, which, as shown in FIG. 4, may include the following steps.

At a first stage, the resetting module may output a signal from the reference signal end to the third node and the fourth node under the control of the resetting signal end (i.e., initialize the third node and the fourth node), the power input module may output a signal from the first power signal end to the second node under the control of the light-emitting signal end, the switch module may be configured to enable the first node to be electrically connected to the second node under the control of the resetting signal end. In other words, at the first stage, the first node, the second node, the third node and the fourth node may be initialized.

At a second stage, the resetting module may output the signal from the reference signal end to the third node and the fourth node under the control of the resetting signal end, the switch module may be configured to enable the first node to be electrically connected to the second node under the control of the resetting signal end, and the power input module may be turned off under the control of the light-emitting signal end. At the second stage, the power input module is in an off state, and the third node is electrically connected to the third node through the resetting module, i.e., the control end and the output end of the switch module are connected to each other. Hence, the first node is discharged toward the fourth node through the driving module, until the potential at the first node is equal to VREF-Vth, where VREF represents a signal from the reference signal end Vref, and Vth represents a threshold voltage of the driving module. This stage is just a threshold voltage writing stage of the driving module.

At a third stage, the writing module may output a signal from the data signal end to the first node under the control of the scanning signal end. At this stage, the writing module is turned on under the control of the scanning signal end, so as to output the signal Vdata from the data signal end to the first node, and the potential at the second node may be changed by the first maintenance module through the signal from the first node. At the second stage, the potential at the first node is equal to that at the second node, and a voltage difference between two ends of the first maintenance module is 0. Hence, at the third stage, the potential at the second node is still equal to that at the first node, i.e., the potential at the second node is Vdata. The third stage is just a first data writing stage.

At a fourth stage, the writing module may output the signal from the data signal end to the first node under the control of the scanning signal end, and the power input module may output the signal from the first power signal end to the second node under the control of the light-emitting signal end. The fourth stage is performed subsequent to the previous stage. Apart from the writing module in the on state, the power input module is also in the on state, so the potential at the second node is reset into a signal Vdd from the first power signal end. At this time, the signal Vdata from the data signal end is still inputted by the writing module to the first node. The fourth stage is just a second data writing stage.

At a fifth stage, the power input module may output the signal from the first power signal end to the second node under the control of the light-emitting signal end, and the driving module may output a signal from the second node to the fourth node under the control of the third node, so as to drive the light-emitting element to emit light. At this stage, the power input module is also in the on state as that in the previous stage, so the potential at the second node may remain unchanged too. The potential at the first node may be stabilized through the first maintenance module, and thereby the potential at the third node may be stabilized too. Hence, the signal from the second node may be outputted to the fourth node by the driving module under the control of the third node, so as to drive the light-emitting element to emit light. Due to the improvement in the stability of the potential at the first node, it is able to ensure the stability of the potential at the key node for driving the light-emitting element to emit light, thereby to improve the display effect of the display panel in the case of high-resolution display. The fifth stage is a light-emission stage.

During the implementation, the method may further include, at the first stage, the fourth stage and the fifth stage, outputting, by the light-emission control module, a signal from the fourth node to the input end of the light-emitting element under the control of the light-emitting signal end. To be specific, at the first stage, the light-emission control module may be turned on under the control of the light-emitting signal end, so as to electrically connect the fourth node to the input end of the light-emitting element, thereby to initialize the input end of the light-emitting element. At the fourth stage and the fifth stage, the light-emission control module may be turned on under the control of the light-emitting signal end, so as to output the signal from the fourth node to the input end of the light-emitting element.

During the implementation, the driving method may further include, at a sixth stage, enabling the resetting module to be turned off under the control of the resetting signal end, enabling the writing module to be turned off under the control of the scanning signal end, and enabling the power input module and the light-emission control module to be turned off under the control of the light-emitting signal end, so as to maintain the second node to be at a potential at the fifth stage. To be specific, during the operation of the pixel circuit, a plurality of high-voltage pulse signals may occur at the light-emitting signal end, and in the case that the high-voltage pulse signal is inputted to the light-emitting signal end, the modules may be turned off under the control of the respective control signal ends. At this time, the power input module and the light-emission control module are in the off state, so a light-emitting loop formed by the first power signal end, the power input module, the driving module, the light-emission control module, the light-emitting element and the second power signal end is in the off state too. The potential at the second node may be maintained through the first maintenance module, so it is impossible to form a discharging loop. As a result, it is able to ensure the potential at the second node to be identical to that at the fifth stage and maintain this potential at a next stage, i.e., a seventh stage, thereby to enable a driving current flowing through the driving module at the seventh stage to be identical to that at the fifth stage. An operation state of the pixel circuit at the seventh stage is identical to that at the fifth stage. Hence, the operation stage of the pixel circuit during, before and after the occurrence of the high-voltage pulse signals at the light-emitting signal end may be identical to that at the fifth stage, the sixth stage and the seventh stage. At this time, it is able to ensure the stability of the potential at the second node and the stability of the driving current flowing through the driving module, i.e., to ensure the stability of the driving current for driving the light-emitting element to emit light, thereby to improve the display effect of the display panel.

It should be appreciated that, the switching transistors and the driving transistors mentioned in the embodiments of the present disclosure may be TFTs or MOSFETs, which will not be particularly defined herein. In an alternative embodiment of the present disclosure, the first electrode and the second electrode of each TFT may be exchanged with each other, so they will not be differentiated from each other. The above description is given by taking the TFT as an example.

Figure 3:
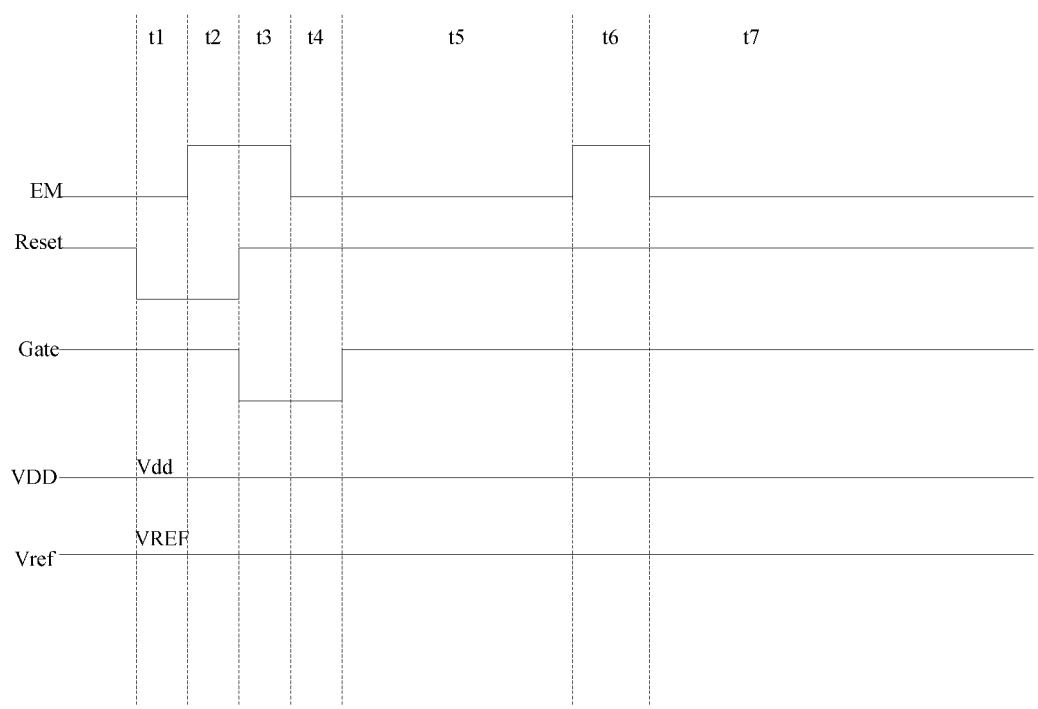
FIG. 3 is a time sequence diagram of the pixel circuit according to at least one embodiment of the present disclosure.

The operation of the pixel circuit in the embodiments of the present disclosure will be described hereinafter in conjunction with the pixel circuit including p-type transistors in FIG. 2 and its time sequence diagram in FIG. 3. To be specific, seven stages t1 to t7 in FIG. 3 may be selected. In the following, 1 represents a high level signal, and 0 represents a low level signal.

At stage t1, EM=0, Reset=0, Gate=1, VDD=Vdd, and Vref=VREF. Because EM=0 and Reset=0, the first switching transistor T1, the third switching transistor T3, the fourth switching transistor T4, the fifth switching transistor T5 and the sixth switching transistor T6 are turned on. Because the fourth switching transistor T4 is in the on state, the signal Vdd from the first power signal end VDD is written into the second node P2. The input end of the light-emitting element OLED is electrically connected to the fourth node P4, i.e., the second electrode of the driving transistor DTFT, through the first switching transistor T1 in the on state. The first node P1 is electrically connected to the second node P2 through the third switching transistor T3 in the on state. The signal VREF from the reference signal end Vref is outputted to the third node P3 and the fourth node P4 through the fifth switching transistor T5 in the on state and the sixth switching transistor T6 in the on state. At this time, the fourth node P4 and the third node P3 are reset, and the gate electrode and the second electrode of the driving transistor DTFT as well as the input end of the light-emitting element OLED are reset at the same time. This stage is just a resetting stage.

At stage t2, EM=1, Reset=0, Gate=1, VDD=Vdd, and Vref=VREF. Because Reset=0, the third switching transistor T3, the fifth switching transistor T5 and the sixth switching transistor T6 are in the on state. The first node P1 is electrically connected to the second node P2 through the third switching transistor T3 in the on state. The signal VREF from the reference signal end Vref is continuously written into the gate electrode (i.e., the third node P3) and the second electrode of the driving transistor DTFT through the fifth switching transistor T5 in the on state and the sixth switching transistor T6 in the on state. At this time, the first switching transistor T1 is in the off state, so the anode (i.e., the input end) of the light-emitting element OLED is maintained at VREF at stage t1 through its own capacitance. A voltage difference between VREF and the signal from the second power signal end VSS is smaller than a threshold voltage of the light-emitting element OLED, so it is able to ensure that the light-emitting element OLED to be in the off state. At this time, the gate electrode and the second electrode of the driving transistor DTFT are connected to each other, and the first electrode of the driving transistor DTFT is discharged to the second electrode, until the driving transistor DTFT is turned off. At this time, the potential at the first electrode of the driving transistor DTFT is changed from Vdd at stage t1 to VREF−Vth, where Vth represents the threshold voltage of the driving transistor DTFT. The voltages at both ends of the third capacitor C3 are the potential at the first node P1, i.e., VREF−Vth, and the potential at the third node, i.e., VREF. This stage is just a threshold voltage writing stage.

At stage t3, EM=1, Reset=1, Gate=0, VDD=Vdd, and Vref=VREF. Because Gate=0, the second switching transistor T2 is in the on state, so as to write the signal Vdata from the data signal end Data into the first node P1. At this time, one end of the third capacitor C3, i.e., the third node P3, is in a floating state, and based on the principle of charge conservation, the voltage difference between the two ends of the third capacitor C3 is −Vth at stage t2. Hence, at this time, the potential at the third node P3 is Vdata+Vth. The potential at the first node P1 is identical to that at the second node P2 at stage t2, so the voltage difference between the two ends of the first capacitor C1 is 0. At stage t3, the potential at the second node P2 is still identical to that that the first node P1, i.e., Vdata. Stage t3 is just a first data writing stage.

At stage t4, EM=0, Reset=1, Gate=0, VDD=Vdd, and Vref=VREF. Because EM=0 and Gate=0, the first switching transistor T1, the second switching transistor T2 and the fourth switching transistor T4 are all in the on state. The signal Vdata from the data signal end Data is continuously written into the first node P1 through the second switching transistor T2 in the on state, so the potential at the third node P3 is maintained at Vdata+Vth. The signal Vdd from the first power signal end VDD is written into the second node P2 through the fourth switching transistor T4 in the on state, so the potential at one end of the first capacitor C1, i.e., the second node P2, is re-written as Vdd, and the writing of the signal from the first node P1 is not adversely affected by the re-writing of the potential. The fourth node P4 is electrically connected to the input end of the light-emitting element OLED through the first switching transistor T1 in the on state. This stage is just a second data writing stage.

At stage t5, EM=0, Reset=1, Gate=1, VDD=Vdd, and Vref=VREF. Because EM=0, the first switching transistor T1 and the fourth switching transistor T4 are both in the on state. The signal Vdd from the first power signal end VDD is continuously written into the second node P2 through the fourth switching transistor T4 in the on state. Because Vdd is inputted to the second node P2 at both stage t5 and stage t4, the potential at the first node P1 may not be adversely affected at a light-emitting stage. In addition, the first capacitor C1 is connected in parallel with the second capacitor C2, so as to further improve the stability of the potential at the first node P1, thereby to improve brightness performance of the light-emitting element OLED. This stage is just a light-emitting stage.

Stage t6 is a second high-voltage pulse closing stage for a multiple-pulse EM signal in the light-emitting stage. At this stage, all the control signals are at a high level, and as compared with stage t5, the first switching transistor T1 and the fourth switching transistor T4 are also in the off state under the control of the light-emitting signal end EM. In this way, the light-emitting loop VDD-T4-DTFT-T1-OLED-VSS is in the off state. The potential at the second node P2 is maintained by the first capacitor C1, so it is impossible to form a discharging loop. As a result, it is able to ensure the potential at the second node P2 at stage t6 to be identical to that at stage t5, and maintain the potential at the node P2 at stage t7, thereby to ensure the current flowing through the driving transistor DTFT at stage t7 to be identical to that at stage t5. The operation state of the pixel circuit at stage t7 is identical to that at stage t5, and thus will not be particularly defined herein.

Based on an identical inventive concept, the present disclosure further provides in some embodiments a display panel including the above-mentioned pixel circuit. A principle of the display panel is similar to that of the pixel circuit, and the implementation thereof may refer to the implementation of the pixel circuit, which will not be particularly defined herein.

Based on an identical inventive concept, the present disclosure provides in some embodiments a display device including the above-mentioned display panel. The display device may be any product or member having a display function, such as a mobile phone, a flat-panel computer, a television, a display, a laptop computer, a digital photo frame or a navigator. A principle of the display device is similar to that of the pixel circuit, and the implementation thereof may refer to the implementation of the pixel circuit, which will not be particularly defined herein.

According to the pixel circuit, its driving method, the display panel and the display device in the embodiments of the present disclosure, the pixel circuit includes the writing module, the driving module, the resetting module, the switch module, the power input module, the first maintenance module and the light-emitting element. The writing module is configured to write the signal from the data signal end into the first node under the control of the scanning signal end. The switch module is configured to electrically connect the first node to the second node under the control of the resetting signal end. The power input module is configured to input the signal from the first power signal end to the second node under the control of the light-emitting signal end. The resetting module is configured to output the signal from the reference signal end to the third node and the fourth node under the control of the resetting signal end. The driving module is configured to output the signal from the second node to the fourth node under the control of the third node. The first maintenance module is configured to stabilize the potentials at the first node and the second node through the signals from the first node and the second node.

Through the operations of the writing module, the driving module, the resetting module, the switch module and the power input module under the control of the respective control signal ends, it is able to drive the light-emitting element to emit light. In addition, through the first maintenance module, it is able to stabilize a potential at a node for driving the light-emitting element to emit light, i.e., stabilize the potentials at the first node and the second node for driving the light-emitting element to emit light. As a result, it is able to stabilize the potential at a key node for driving the light-emitting element to emit light, thereby to improve a display effect of the display panel in the case of high-resolution display.

The above are merely the preferred embodiments of the present disclosure. Obviously, a person skilled in the art may make further modifications and improvements without departing from the spirit of the present disclosure, and these modifications and improvements shall also fall within the scope of the present disclosure.

What is claimed is:

1. A pixel circuit, comprising a writing module, a driving module, a resetting module, a switch module, an power input module, a first maintenance module, a light-emitting element, a second maintenance module, and a light-emission control module, wherein
a control end of the writing module is connected to a scanning signal end, an input end of the writing module is connected to a data signal end, and an output end of the writing module is connected to a first node;
the writing module is configured to write a signal from the data signal end into the first node under the control of the scanning signal end;
a control end of the switch module is connected to a resetting signal end, an input end of the switch module is connected to a second node, and an output end of the switch module is connected to the first node;
the switch module is configured to electrically connect the first node to the second node under the control of the resetting signal end;
a control end of the power input module is connected to a light-emitting signal end, an input end of the power input module is connected to a first power signal end, and an output end of the power input module is connected to the second node;
the power input module is configured to input a signal from the first power signal end into the second node under the control of the light-emitting signal end;
a first control end and a second control end of the resetting module are connected to the resetting signal end, an input end of the resetting module is connected to a reference signal end, a first output end of the resetting module is connected to a third node, and a second output end of the resetting module is connected to a fourth node;
the resetting module is configured to output a signal from the reference signal end to the third node and the fourth node under the control of the resetting signal end;
a control end of the driving module is connected to the third node, a first input end of the driving module is connected to the first node, a second input end of the driving module is connected to the second node, and an output end of the driving module is connected to the fourth node;
a signal from the first node is configured to adjust a potential at the third node;
the driving module is configured to output a signal from the second node to the fourth node under the control of the third node;
the light-emitting element is connected between the fourth node and a second power signal end;
the first maintenance module is connected between the first node and the second node, and configured to stabilize potentials at the first node and the second node through the signals from the first node and the second node, wherein the first maintenance module comprises a first capacitor connected between the first node and the second node;
the second maintenance module is connected between the first power signal end and the first node, and configured to stabilize the potential at the first node through the signal from the first power signal end, wherein the second maintenance module comprises a second capacitor connected between the first power signal end and the first node;
wherein a control end of the light-emission control module is connected to the light-emitting signal end, an input end of the light-emission control module is connected to the fourth node, an output end of the light-emission control module is connected to an input end of the light-emitting element, and the light-emission control module is configured to output a signal from the fourth node to the input end of the light-emitting element under the control of the light-emitting signal end; and
wherein the light-emission control module comprises a first switching transistor, a gate electrode of the first switching transistor is connected to the light-emitting signal end, a first electrode of the first switching transistor is connected to the fourth node, and a second electrode of the first switching transistor is connected to the input end of the light-emitting element.

2. The pixel circuit according to claim 1, wherein the writing module comprises a second switching transistor, a gate electrode of the second switching transistor is connected to the scanning signal end, a first electrode of the second switching transistor is connected to the data signal end, and a second electrode of the second switching transistor is connected to the first node.

3. The pixel circuit according to claim 2, wherein the switch module comprises a third switching transistor, a gate electrode of the third switching transistor is connected to the resetting signal end, a first electrode of the third switching transistor is connected to the second node, and a second node of the third switching transistor is connected to the first node.

4. The pixel circuit according to claim 3, wherein the power input module comprises a fourth switching transistor, a gate electrode of the fourth switching transistor is connected to the light-emitting signal end, a first electrode of the fourth switching transistor is connected to a first power signal end, and a second electrode of the fourth switching transistor is connected to the second node.

5. The pixel circuit according to claim 4, wherein the resetting module comprises:
a fifth switching transistor, a gate electrode of which is connected to the resetting signal end, a first electrode of which is connected to the reference signal end and a second electrode of which is connected to the third node; and
a sixth switching transistor, a gate electrode of which is connected to the resetting signal end, a first electrode of which is connected to the reference signal end, and a second electrode of which is connected to the fourth node.

6. The pixel circuit according to claim 5, wherein the driving module comprises:
a driving transistor, a gate electrode of which is connected to the third node, a first electrode of which is connected to the second node, and a second electrode of which is connected to the fourth node; and
a third capacitor connected between the first node and the third node.

7. The pixel circuit according to claim 6, wherein the first switching transistor, the second switching transistor, the third switching transistor, the fourth switching transistor, the fifth switching transistor, the sixth switching transistor and the driving transistor are all thin film transistors (TFT)s or metal oxide semiconductor field effect transistors (MOSFETs).

8. A display panel, comprising:
a pixel circuit having a writing module, a driving module, a resetting module, a switch module, a power input module, a first maintenance module, a light-emitting element, a second maintenance module, and a light-emission control module, wherein a control end of the writing module is connected to a scanning signal end, an input end of the writing module is connected to a data signal end, and an output end of the writing module is connected to a first node;

the writing module is configured to write a signal from the data signal end into the first node under the control of the scanning signal end;

a control end of the switch module is connected to a resetting signal end, an input end of the switch module is connected to a second node, and an output end of the switch module is connected to the first node;

the switch module is configured to electrically connect the first node to the second node under the control of the resetting signal end;

a control end of the power input module is connected to a light-emitting signal end, an input end of the power input module is connected to a first power signal end, and an output end of the power input module is connected to the second node;

the power input module is configured to input a signal from the first power signal end into the second node under the control of the light-emitting signal end;

a first control end and a second control end of the resetting module are connected to the resetting signal end, an input end of the resetting module is connected to a reference signal end, a first output end of the resetting module is connected to a third node, and a second output end of the resetting module is connected to a fourth node;

the resetting module is configured to output a signal from the reference signal end to the third node and the fourth node under the control of the resetting signal end;

a control end of the driving module is connected to the third node, a first input end of the driving module is connected to the first node, a second input end of the driving module is connected to the second node, and an output end of the driving module is connected to the fourth node;

a signal from the first node is configured to adjust a potential at the third node:

the driving module is configured to output a signal from the second node to the fourth node under the control of the third node;

the light-emitting element is connected between the fourth node and a second power signal end;

the first maintenance module is connected between the first node and the second node, and configured to stabilize potentials at the first node and the second node through the signals from the first node and the second node, wherein the first maintenance module comprises a first capacitor connected between the first node and the second node;

the second maintenance module is connected between the first power signal end and the first node, and configured to stabilize the potential at the first node through the signal from the first power signal end, wherein the second maintenance module comprises a second capacitor connected between the first power signal end and the first node;

wherein a control end of the light-emission control module is connected to the light-emitting signal end, an input end of the light-emission control module is connected to the fourth node, an output end of the light-emission control module is connected to an input end of the light-emitting element, and the light-emission control module is configured to output a signal from the fourth node to the input end of the light-emitting element under the control of the light-emitting signal end; and wherein the light-emission control module comprises a first switching transistor, a gate electrode of the first switching transistor is connected to the light-emitting signal end, a first electrode of the first switching transistor is connected to the fourth node, and a second electrode of the first switching transistor is connected to the input end of the light-emitting element.

9. A display device, comprising:

a display panel including a pixel circuit having a writing module, a driving module, a resetting module, a switch module, a power input module, a first maintenance module, a light-emitting element, a second maintenance module, and a light-emission control module, wherein a control end of the writing module is connected to a scanning signal end, an input end of the writing module is connected to a data signal end, and an output end of the writing module is connected to a first node;

the writing module is configured to write a signal from the data signal end into the first node under the control of the scanning signal end;

a control end of the switch module is connected to a resetting signal end, an input end of the switch module is connected to a second node, and an output end of the switch module is connected to the first node;

the switch module is configured to electrically connect the first node to the second node under the control of the resetting signal end;

a control end of the power input module is connected to a light-emitting signal end, an input end of the power input module is connected to a first power signal end, and an output end of the power input module is connected to the second node;

the power input module is configured to input a signal from the first power signal end into the second node under the control of the light-emitting signal end;

a first control end and a second control end of the resetting module are connected to the resetting signal end, an input end of the resetting module is connected to a reference signal end, a first output end of the resetting module is connected to a third node, and a second output end of the resetting module is connected to a fourth node;

the resetting module is configured to output a signal from the reference signal end to the third node and the fourth node under the control of the resetting signal end;

a control end of the driving module is connected to the third node, a first input end of the driving module is connected to the first node, a second input end of the driving module is connected to the second node, and an output end of the driving module is connected to the fourth node;

a signal from the first node is configured to adjust a potential at the third node:

the driving module is configured to output a signal from the second node to the fourth node under the control of the third node;

the light-emitting element is connected between the fourth node and a second power signal end;

the first maintenance module is connected between the first node and the second node, and configured to stabilize potentials at the first node and the second node through the signals from the first node and the second node, wherein the first maintenance module comprises a first capacitor connected between the first node and the second node;

the second maintenance module is connected between the first power signal end and the first node, and configured to stabilize the potential at the first node through the signal from the first power signal end, wherein the second maintenance module comprises a second capacitor connected between the first power signal end and the first node;

wherein a control end of the light-emission control module is connected to the light-emitting signal end, an input end of the light-emission control module is connected to the fourth node, an output end of the light-emission control module is connected to an input end of the light-emitting element, and the light-emission control module is configured to output a signal from the fourth node to the input end of the light-emitting element under the control of the light-emitting signal end; and wherein the light-emission control module comprises a first switching transistor, a gate electrode of the first switching transistor is connected to the light-emitting signal end, a first electrode of the first switching transistor is connected to the fourth node, and a second electrode of the first switching transistor is connected to the input end of the light-emitting element.

10. The pixel circuit according to claim 1, further comprising a light-emission control module, wherein a control end of the light-emission control module is connected to the light-emitting signal end, an input end of the light-emission control module is connected to the fourth node, an output end of the light-emission control module is connected to an input end of the light-emitting element, and the light-emission control module is configured to output a signal from the fourth node to the input end of the light-emitting element under the control of the light-emitting signal end.

11. The display panel according to claim 8, wherein the pixel circuit further includes a light-emission control module, wherein a control end of the light-emission control module is connected to the light-emitting signal end, an input end of the light-emission control module is connected to the fourth node, an output end of the light-emission control module is connected to an input end of the light-emitting element, and the light-emission control module is configured to output a signal from the fourth node to the input end of the light-emitting element under the control of the light-emitting signal end.

12. The display device according to claim 9, wherein the pixel circuit further includes a light-emission control module, wherein a control end of the light-emission control module is connected to the light-emitting signal end, an input end of the light-emission control module is connected to the fourth node, an output end of the light-emission control module is connected to an input end of the light-emitting element, and the light-emission control module is configured to output a signal from the fourth node to the input end of the light-emitting element under the control of the light-emitting signal end.

* * * * *